US010291215B2

(12) United States Patent
Haneda

(10) Patent No.: US 10,291,215 B2
(45) Date of Patent: May 14, 2019

(54) DATA PROCESSING CIRCUIT, PHYSICAL QUANTITY DETECTION CIRCUIT, PHYSICAL QUANTITY DETECTION DEVICE, ELECTRONIC APPARATUS, AND MOVING OBJECT

(71) Applicant: Seiko Epson Corporation, Tokyo (JP)

(72) Inventor: Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 268 days.

(21) Appl. No.: 15/071,359

(22) Filed: Mar. 16, 2016

(65) Prior Publication Data
US 2016/0282116 A1 Sep. 29, 2016

(30) Foreign Application Priority Data
Mar. 23, 2015 (JP) ................................ 2015-059326

(51) Int. Cl.
*G01C 19/5649* (2012.01)
*H03K 5/13* (2014.01)
*H03K 5/00* (2006.01)

(52) U.S. Cl.
CPC ........... *H03K 5/13* (2013.01); *G01C 19/5649* (2013.01); *H03K 2005/00052* (2013.01)

(58) Field of Classification Search
CPC ................. G01C 19/5649; H03K 2005/00052
See application file for complete search history.

(56) References Cited

U.S. PATENT DOCUMENTS

| 5,125,042 | A | * | 6/1992 | Kerr | ..................... G06F 17/175 358/1.9 |
| 5,982,432 | A | * | 11/1999 | Uenoyama | ........... H04N 11/044 348/453 |
| 7,343,616 | B1 | * | 3/2008 | Takahashi | .............. H04H 60/65 348/E5.105 |
| 7,352,305 | B2 | * | 4/2008 | Kiriyama | ........... G01D 5/24404 341/111 |
| 7,602,581 | B2 | * | 10/2009 | Heise | ................. G11B 5/59616 360/78.04 |
| 8,073,729 | B2 | * | 12/2011 | Kisin | ..................... G06Q 10/04 705/400 |
| 8,093,926 | B2 | * | 1/2012 | Inukai | ................ G01C 19/5607 327/108 |
| 8,903,926 | B2 | * | 12/2014 | Bastide | ................... H04L 51/32 709/206 |
| 2005/0141033 | A1 | | 6/2005 | Nishioka | |

(Continued)

FOREIGN PATENT DOCUMENTS

JP 2005-192174 A 7/2005
JP 2006-279977 A 10/2006
(Continued)

*Primary Examiner* — Thienvu V Tran
*Assistant Examiner* — Pinping Sun
(74) *Attorney, Agent, or Firm* — Harness, Dickey & Pierce, P.L.C.

(57) ABSTRACT

A data processing circuit includes an interpolation circuit that performs an interpolation process on an input digital signal and outputs interpolated data subjected to the interpolation process. A reading request signal making a request for outputting the interpolated data is input, and the interpolation circuit performs the interpolation process based on the digital signal input earlier than a timing at which the reading request signal is input.

20 Claims, 11 Drawing Sheets

(56) References Cited

U.S. PATENT DOCUMENTS

| | | | |
|---|---|---|---|
| 2006/0235883 A1* | 10/2006 | Krebs | G06F 17/3002 |
| 2006/0277238 A1 | 12/2006 | Heeb | |
| 2007/0035417 A1 | 2/2007 | Kiriyama et al. | |
| 2007/0058929 A1* | 3/2007 | Chaffee | G05B 19/0423 |
| | | | 386/316 |
| 2008/0192875 A1 | 8/2008 | Saito et al. | |
| 2010/0197401 A1* | 8/2010 | Altshuler | A63F 13/10 |
| | | | 463/35 |
| 2012/0098328 A1* | 4/2012 | Shimomura | H05B 37/0245 |
| | | | 307/1 |
| 2012/0221584 A1* | 8/2012 | Williamson | G06F 17/30914 |
| | | | 707/756 |
| 2013/0322462 A1* | 12/2013 | Poulsen | H04J 3/06 |
| | | | 370/458 |
| 2014/0324375 A1* | 10/2014 | Seo | G01P 21/00 |
| | | | 702/104 |
| 2015/0122034 A1* | 5/2015 | Maki | H02M 3/158 |
| | | | 73/649 |
| 2015/0160011 A1* | 6/2015 | Nakajima | G01C 19/5776 |
| | | | 702/56 |
| 2016/0114867 A1 | 4/2016 | Nicol | |

FOREIGN PATENT DOCUMENTS

| | | |
|---|---|---|
| JP | 2006-345508 A | 12/2006 |
| JP | 2007-071865 A | 3/2007 |
| JP | 2007-184881 A | 7/2007 |
| JP | 2008-219859 A | 9/2008 |
| WO | WO-2014-183212 A1 | 11/2014 |

\* cited by examiner

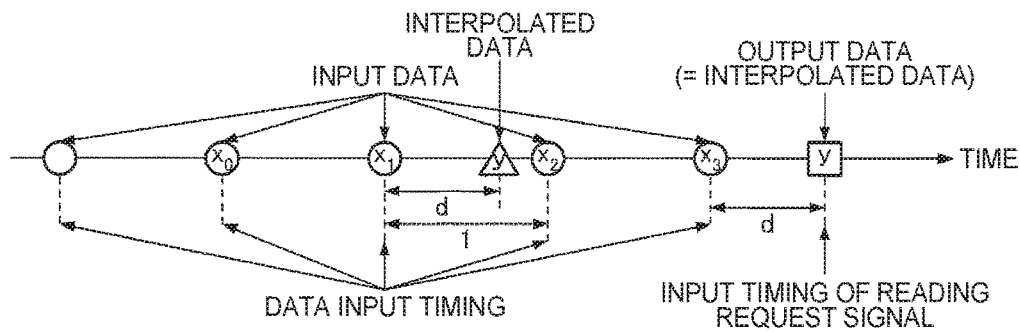
FIG. 8
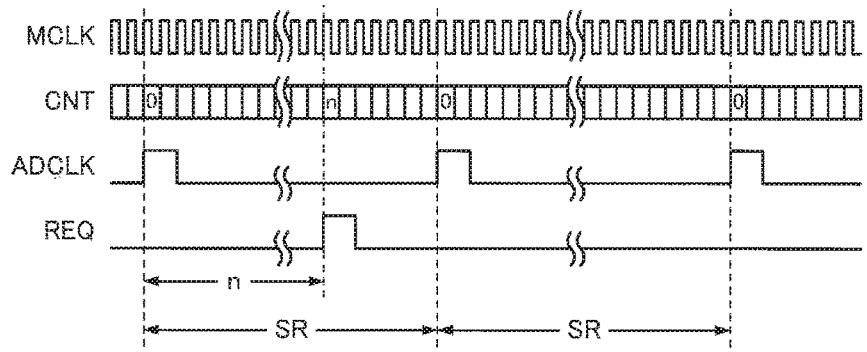
FIG. 9
/— 49 LOOKUP TABLE
| CNT | $K_1$ | $K_2$ | $K_3$ | $K_4$ |
|---|---|---|---|---|
| $0 \sim n_1-1$ | $d_{01}$ | $d_{02}$ | $d_{03}$ | $d_{04}$ |
| $n_1 \sim n_2-1$ | $d_{11}$ | $d_{12}$ | $d_{13}$ | $d_{14}$ |
| $n_2 \sim n_3-1$ | $d_{21}$ | $d_{22}$ | $d_{23}$ | $d_{24}$ |
| ⋮ | | | | |
FIG. 10

49 LOOKUP TABLE

| CNT | na1 | na2 | na3 | na4 | ns1 | ns2 | ns3 | ns4 | nb1 | nb2 | nb3 | nb4 |
|---|---|---|---|---|---|---|---|---|---|---|---|---|
| $0 \sim n_1-1$ | | | | | | | | | | | | |
| $n_1 \sim n_2-1$ | | | | | | | | | | | | |
| $n_2 \sim n_3-1$ | | | | | | | | | | | | |
| ⋮ | | | | | | | | | | | | |

DATA PROCESSING CIRCUIT, PHYSICAL QUANTITY DETECTION CIRCUIT, PHYSICAL QUANTITY DETECTION DEVICE, ELECTRONIC APPARATUS, AND MOVING OBJECT

BACKGROUND

1. Technical Field

The present invention relates to a data processing circuit, a physical quantity detection circuit, a physical quantity detection device, an electronic apparatus, and a moving object.

2. Related Art

At present, physical quantity detection devices capable of detecting various physical quantities, such as acceleration sensors detecting acceleration and gyro sensors detecting angular velocities, are widely used for various systems or electronic apparatuses. Physical quantity detection devices in which A/D conversion circuits convert physical quantity detection signals (analog signals) into digital signals and output detection information as digital data can output digital signal with high noise resistance. Therefore, systems that include the physical quantity detection devices and MCUs receiving digital data and performing calculation can ensure high reliability.

In the systems, when the MCUs do not synchronize frequencies for sampling the digital data with sampling frequencies of A/D conversion circuits included in the physical quantity detection devices, there is a problem that folding noise of signals occurs by reception (sampling) of the MCUs. JP-A-2006-345508 discloses a frequency conversion method of initializing a circuit from a sampling rate ratio of an input to an output and performing optimum over/under sampling and filter processing.

However, in the frequency conversion method disclosed in JP-A-2006-345508, it is necessary to know the sampling rate ratio. Therefore, when the sampling rate ratio can be comprehended in advance, the frequency conversion method is effective. However, in an event in which the MCU acquires data at an irregular timing, it is difficult to comprehend an exact sampling rate ratio and the frequency conversion method is not necessarily an effective method.

SUMMARY

An advantage of some aspects of the invention is to provide a data processing circuit capable of reducing occurrence of folding noise in an output signal even when an input timing of a digital signal is asynchronous with a reading request timing. Another advantage of some aspects of the invention is to provide a physical quantity detection circuit capable of reducing occurrence of folding noise in an output signal even when a sampling timing of an analog signal related to a physical quantity is asynchronous with a reading request timing. Still another advantage of some aspects of the invention is to provide a physical quantity detection device using the physical quantity detection circuit. Yet another advantage of some aspects of the invention is to provide an electronic apparatus and a moving object using the physical quantity detection device.

The invention can be implemented as the following forms or application examples.

APPLICATION EXAMPLE 1

A data processing circuit according to this application example includes an interpolation circuit that performs an interpolation process on an input digital signal and outputs interpolated data subjected to the interpolation process. A reading request signal making a request for outputting the interpolated data is input, and the interpolation circuit performs the interpolation process based on the digital signal input earlier than a timing at which the reading request signal is input.

In the data processing circuit according to this application example, a digital signal recently input at the timing at which the reading request signal is input is not output, but the interpolated data subjected to the interpolation process based on the previously input digital signal is output. Even when the input timing of the digital signal is asynchronous with the reading request timing, it is possible to reduce occurrence of folding noise to an output signal.

APPLICATION EXAMPLE 2

The data processing circuit according to the application example may further include an interface circuit. The interface circuit may output the reading request signal according to an input communication signal. The interpolation circuit may output the interpolated data in response to the reading request signal. The interpolated data may be output via the interface circuit.

In the data processing circuit according to this application example, the interpolated data is output in response to the reading request signal synchronous with the communication signal input via the interface circuit. Therefore, even when the input timing of the digital signal is asynchronous with the input timing of the communication signal, it is possible to reduce occurrence of folding noise to a signal output via the interface circuit.

APPLICATION EXAMPLE 3

In the data processing circuit according to the application example, the interpolation circuit may perform the interpolation process based on a time from an input timing of the digital signal to an input timing of the reading request signal and a plurality of the digital signals input earlier than the input timing of the digital signal.

In the data processing circuit according to this application example, the interpolation circuit can generate the appropriate interpolated data according to the time from the input timing of the digital signal to the input timing of the reading request signal. It is possible to reduce occurrence of folding noise to the output signal.

APPLICATION EXAMPLE 4

In the data processing circuit according to the application example, the interpolation circuit may perform the interpolation process by a cubic interpolation method.

In the data processing circuit according to this application example, the interpolation circuit can perform the correction process with relatively high accuracy by the cubic interpolation method (for example, a Bi-Cubic method). It is possible to reduce occurrence of folding noise to the output signal.

APPLICATION EXAMPLE 5

In the data processing circuit according to the application example, the interpolation circuit may perform the interpolation process in response to the reading request signal.

In the data processing circuit according to this application example, the interpolation circuit does not perform the correction process at all times, but performs the interpolation process in response to the reading request signal. Therefore, it is possible to reduce power consumption.

APPLICATION EXAMPLE 6

In the data processing circuit according to the application example, the interpolation circuit may store data related to a relation between a calculation coefficient of the interpolation process and a timing at which the reading request signal is input.

In the data processing circuit according to this application example, it is not necessary for the interpolation circuit to calculate the calculation coefficient of the interpolation process using the stored data. Therefore, the correction process can be performed in a short time using a circuit (for example, an addition circuit) with a small size instead of a circuit (for example, a multiplier) with a large size.

APPLICATION EXAMPLE 7

A physical quantity detection circuit according to this application example includes: an A/D conversion circuit that performs A/D conversion on an analog signal related to a physical quantity; a digital filter circuit to which a signal from the A/D conversion circuit is input; an interpolation circuit to which a digital signal from the digital filter circuit is input, which performs an interpolation process on the digital signal, to which a reading request signal making a request for outputting interpolated data subjected to the interpolation process is input, and which performs the interpolation process based on the digital signal input earlier than a timing at which the reading request signal is input; and an interface circuit that outputs the reading request signal according to an input communication signal. The interpolated data is output via the interface circuit.

In the physical quantity detection circuit according to this application example, the interpolation circuit does not output the digital signal obtained when the A/D conversion circuit recently samples and converts the analog signal related to the physical quantity at the timing at which the reading request signal synchronous with the communication signal input via the interface circuit is input, but outputs the interpolated data subjected to the interpolation process based on the digital signal obtained when the A/D conversion circuit previously samples and the convert the analog signal. Accordingly, even when the sampling timing by the A/D conversion circuit is asynchronous with the reading request timing based on the communication signal, it is possible to reduce occurrence of folding noise to the output signal.

APPLICATION EXAMPLE 8

In the physical quantity detection circuit according to the application example, the interpolation circuit may perform the interpolation process in response to the reading request signal.

In the physical quantity detection circuit according to this application example, the interpolation circuit does not perform the correction process at all times, but performs the interpolation process in response to the reading request signal. Therefore, it is possible to reduce power consumption.

APPLICATION EXAMPLE 9

In the physical quantity detection circuit according to the application example, the interpolation circuit may store data related to a relation between a calculation coefficient of the interpolation process and a timing at which the reading request signal is input.

In the physical quantity detection circuit according to this application example, it is not necessary for the interpolation circuit to calculate the calculation coefficient of the interpolation process using the stored data. Therefore, the correction process can be performed in a short time using a circuit (for example, an addition circuit) with a small size instead of a circuit (for example, a multiplier) with a large size.

APPLICATION EXAMPLE 10

A physical quantity detection device according to this application example includes: any of the physical quantity detection circuits described above; and a physical quantity detection element. An analog signal is a signal output from the physical quantity detection element.

According to this application example, it is possible to provide the physical quantity detection device capable of reducing occurrence of folding noise to the output signal even when the sampling timing of the analog signal related to the physical quantity is asynchronous with the reading request timing.

APPLICATION EXAMPLE 11

In the physical quantity detection device according to the application example, the physical quantity detection element may be an inertial sensor.

According to this application example, it is possible to provide the physical quantity detection device capable of reducing occurrence of folding noise to the output signal even when the sampling timing of the analog signal related to an inertial quantity is asynchronous with the reading request timing.

APPLICATION EXAMPLE 12

An electronic apparatus according to this application example includes: any of the physical quantity detection devices described above; and a control device that transmits a communication signal.

APPLICATION EXAMPLE 13

A moving object according to this application example includes: any of the physical quantity detection devices described above; and a control device that transmits a communication signal.

According to these application examples, the physical quantity detection device is used which is capable of reducing occurrence of folding noise to the output signal even when the sampling timing of the analog signal related to a physical quantity is asynchronous with the reading request timing. Therefore, it is possible to also realize the electronic apparatus and the moving object with high reliability.

BRIEF DESCRIPTION OF THE DRAWINGS

The invention will be described with reference to the accompanying drawings, wherein like numbers reference like elements.

FIG. 8 is a diagram illustrating a Bi-Cubic method.

FIG. 9 is a diagram illustrating examples of timing charts of a master clock signal, a counter output signal, a sampling clock signal, and a reading request signal.

FIG. 10 is a diagram illustrating an example of a lookup table according to a first embodiment.

DESCRIPTION OF EXEMPLARY EMBODIMENTS

Hereinafter, preferred embodiments of the invention will be described in detail with reference to the drawings. Content of the invention described in the appended claims is not inappropriately limited in the embodiments to be described below. All of the configurations to be described below are not prerequisites of the invention.

Hereinafter, a physical quantity detection device (angular velocity detection device) detecting an angular velocity as a physical quantity will be described as an example.

1. Physical Quantity Device 1-1. First Embodiment

Configuration of Physical Quantity Detection Device

Figure 1:
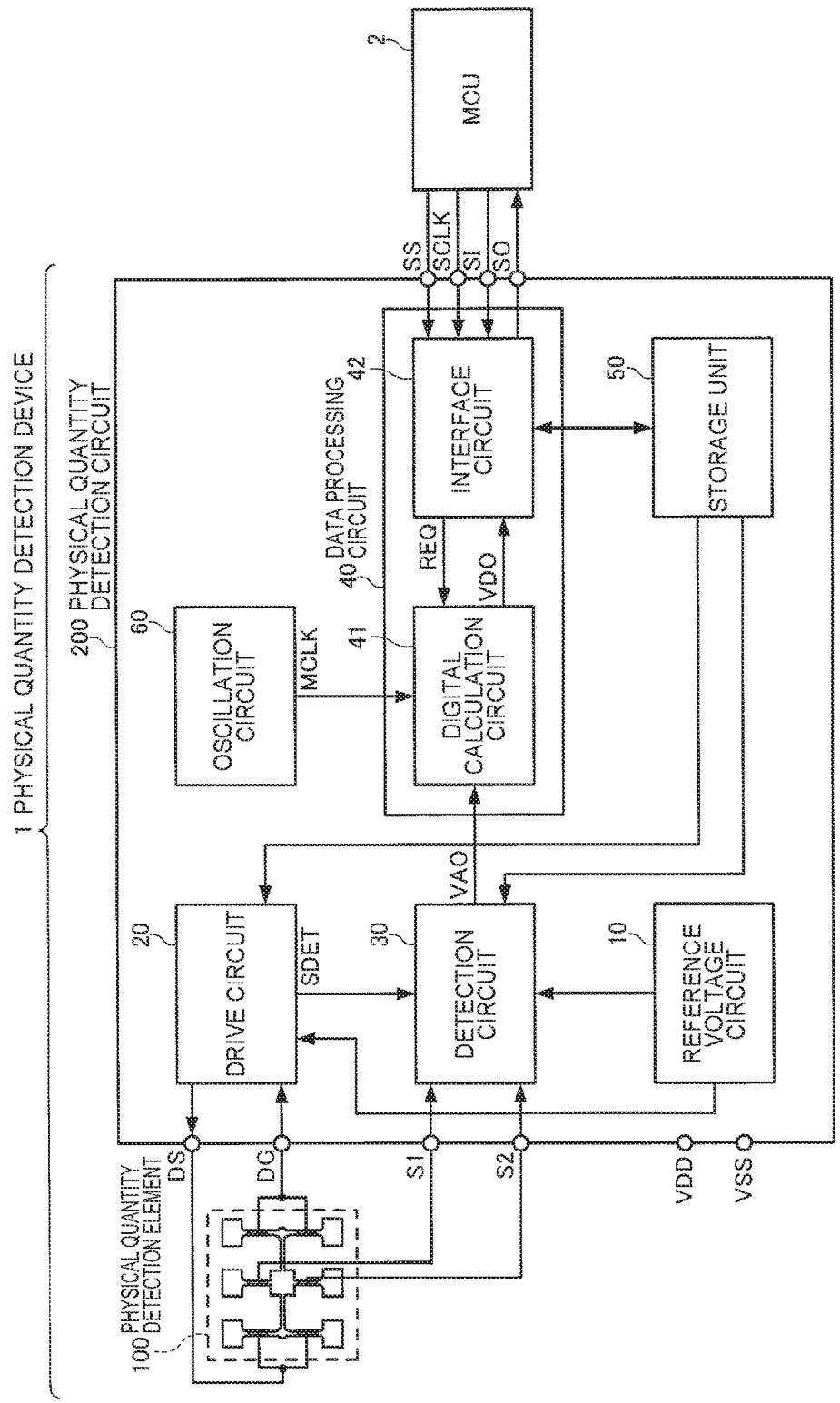
FIG. 1 is a diagram illustrating an example of the configuration of a physical quantity detection device according to an embodiment.

FIG. 1 is a functional block diagram illustrating a physical quantity detection device (angular velocity detection device) according to an embodiment. A physical quantity detection device 1 according to the embodiment is configured to include a physical quantity detection element (sensor element) 100 that outputs an analog signal related to a physical quantity and a physical quantity detection circuit 200.

The physical quantity detection element 100 includes a vibrator element in which a drive electrode and a detection electrode are disposed. In general, the vibrator element is sealed to a package in which airtightness is ensured in order to reduce impedance of the vibrator element as much as possible and improve oscillation efficiency. In the embodiment, the physical quantity detection element 100 includes a so-called double T type vibrator element that includes two T type drive vibration arms.

Figure 2:
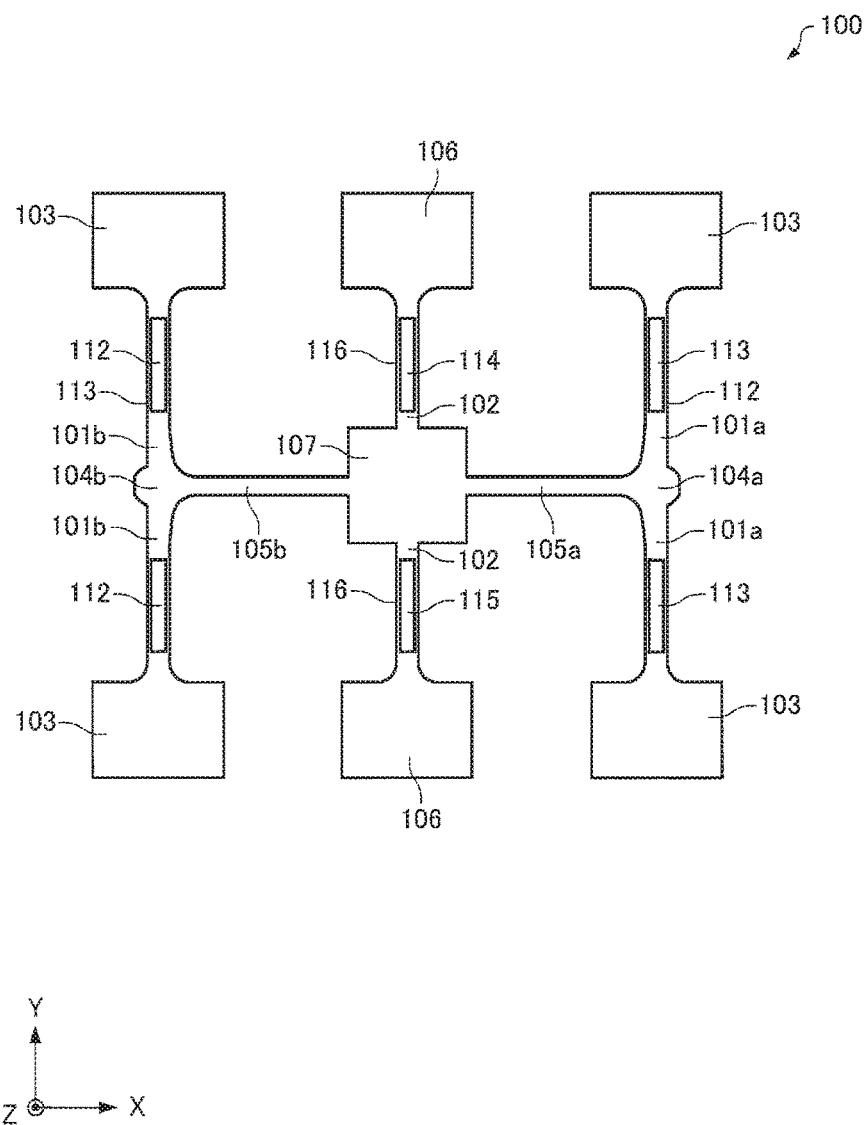
FIG. 2 is a plan view illustrating a vibrator element of a physical quantity detection element.

FIG. 2 is a plan view illustrating the vibrator element of the physical quantity detection element 100 according to the embodiment. The physical quantity detection element 100 includes, for example, a double T type vibrator element formed by a Z-cut quartz crystal substrate. In the vibrator element formed using quartz crystal as a material, a variation in a resonance frequency to a temperature change is considerably small. There is the advantage of improving detection accuracy of an angular velocity. In FIG. 2, X, Y, and Z axes are illustrated as quartz crystal axes.

As illustrated in FIG. 2, in the vibrator element of the physical quantity detection element 100, drive vibration arms 101a and 101b extend from two drive base portions 104a and 104b in the +Y axis direction and the −Y axis direction. Drive electrodes 112 and 113 are respectively formed on the side and upper surfaces of the drive vibration arms 101a, and drive electrodes 113 and 112 are respectively formed on the side and upper surfaces of the drive vibration arms 101b. The drive electrodes 112 and 113 are respectively connected to a drive circuit 20 via DS and DG terminals of the physical quantity detection circuit 200 illustrated in FIG. 1.

The drive base portions 104a and 104b are connected to a rectangular detection base portion 107 via connection arms 105a and 105b extending in the −X axis direction and the +X axis direction, respectively.

Detection vibration arms 102 extend from the detection base portion 107 in the +Y axis direction and the −Y axis direction. Detection electrodes 114 and 115 are formed on the upper surfaces of the detection vibration arms 102 and common electrodes 116 are formed on the side surfaces of the detection vibration arms 102. The detection electrodes 114 and 115 are respectively connected to a detection circuit 30 via S1 and S2 terminals of the physical quantity detection circuit 200 illustrated in FIG. 1. The common electrodes 116 are grounded.

Figure 3:
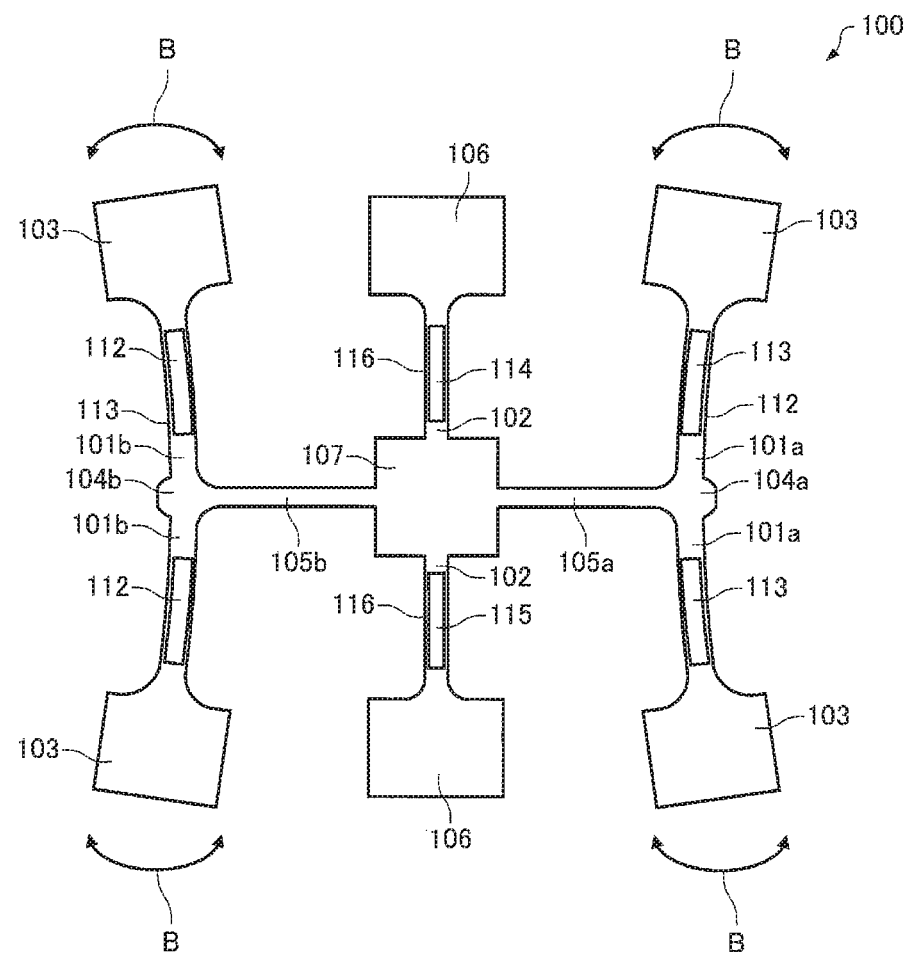
FIG. 3 is a diagram illustrating an operation of the physical quantity detection element.

When an alternating-current voltage is a given as a drive signal between the drive electrodes 112 and the drive electrodes 113 of the drive vibration arms 101a and 101b, as illustrated in FIG. 3, the drive vibration arms 101a and 101b perform flexural vibration (excitation vibration) in such a manner that the front ends of the two drive vibration arms 101a and 101b repeatedly approach and separate mutually, as indicated by arrows B by an inverse piezoelectric effect.

Figure 4:
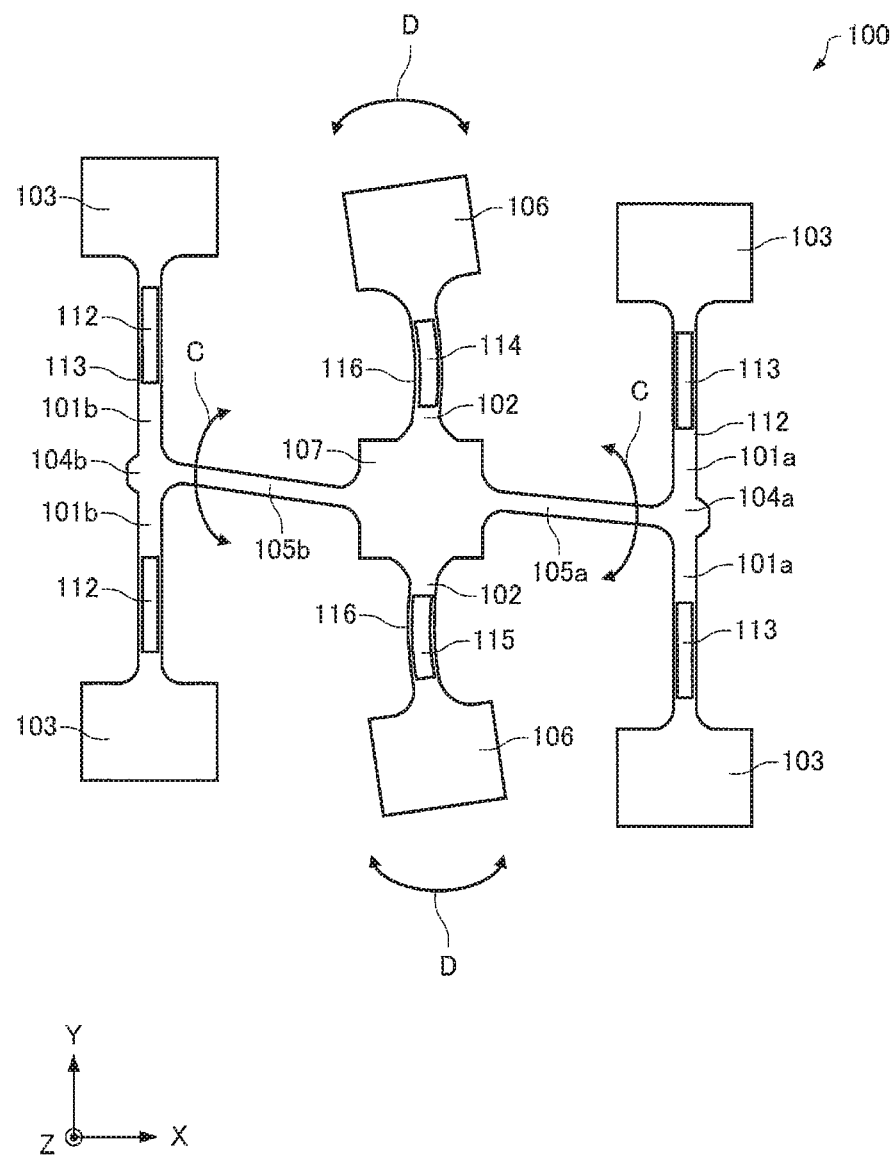
FIG. 4 is a diagram illustrating an operation of the physical quantity detection element.

In this state, when an angular velocity is applied to the vibrator element of the physical quantity detection element 100 using the Z axis as a rotation axis, the drive vibration arms 101a and 101b obtain the Coriolis force in a direction perpendicular to both of the direction of the flexural vibration indicated by the arrows B and the Z axis. As a result, as illustrated in FIG. 4, the connection arms 105a and 105b vibrate, as indicated by arrows C. The detection vibration arms 102 perform flexural vibration, as indicated by arrows D, in linkage with the vibration (indicated by the arrows C) of the connection arms 105a and 105b. The phases of the flexural vibration of the detection vibration arms 102 accompanied with the Coriolis force and the flexural vibration (excitation vibration) of the drive vibration arms 101a and 101b are deviated by 90°.

Incidentally, when the magnitudes of vibration energies or the magnitudes of the amplitudes of the vibration at the time of the flexural vibration (excitation vibration) of the drive vibration arms 101a and 101b are the same between the two drive vibration arms 101a and 101b, the vibration energies of the drive vibration arms 101a and 101b are balanced. Thus, in a state in which no angular velocity is applied to the physical quantity detection element 100, the detection vibration arms 102 do not perform flexural vibration. Incidentally, when the balance of the vibration energies of the two drive vibration arms 101a and 101b is collapsed, the flexural vibration is generated in the detection vibration arms 102 even in a state in which no angular velocity is applied to the physical quantity detection element 100. This flexural vibration is referred to as leakage vibration and is flexural vibration indicated by the arrows D as in the vibration based on the Coriolis force, but the has the same phase as the drive signal.

Alternating-current charges based on the flexural vibration are generated in the detection electrodes 114 and 115 of the detection vibration arms 102 by a piezoelectric effect. Here, the alternating-current charges generated based on the Coriolis force are changed according to the magnitude of the Coriolis force (in other words, the magnitude of the angular velocity applied to the physical quantity detection element 100). On the other hand, the alternating-current charges generated based on the leakage vibration are constant regardless of the magnitude of the angular velocity applied to the physical quantity detection element 100.

Rectangular weight portions 103 with widths wider the drive vibration arms 101a and 101b are formed at the front ends of the drive vibration arms 101a and 101b. By forming the weight portions 103 at the front ends of the drive vibration arms 101a and 101b, it is possible to increase the Coriolis force and it is possible to obtain vibration arms with relatively short desired resonance frequency. Similarly, rectangular weight portions 106 with widths wider than the detection vibration arms 102 are formed at the front ends of the detection vibration arms 102. By forming the weight portions 106 at the front ends of the detection vibration arms 102, it is possible to increase alternating-current charges generated in the detection electrodes 114 and 115.

In this way, the physical quantity detection element 100 outputs the alternating-current charge (a vibration leakage component) based on leakage vibration of the excitation vibration and the alternating-current charge (an angular velocity component) based on the Coriolis force, using the Z axis as a detection axis, via the detection electrodes 114 and 115. The physical quantity detection element 100 functions as an inertial sensor that detects an angular velocity.

Referring back to FIG. 1, the physical quantity detection circuit 200 according to the embodiment is configured to include a reference voltage circuit 10, the drive circuit 20, the detection circuit 30, a data processing circuit 40, a storage unit 50, and an oscillation circuit 60. The physical quantity detection circuit 200 may be, for example, an integrated circuit (IC) of one chip. The physical quantity detection circuit 200 according to the embodiment may be configured such that some of these elements may be omitted or changed or other elements may be added.

The reference voltage circuit 10 generates a constant voltage or a constant current such as a reference voltage (analog ground voltage) from a power supply voltage supplied from a VDD terminal of the physical quantity detection circuit 200 and supplies the constant voltage or the constant current to the drive circuit 20 or the detection circuit 30.

The drive circuit 20 generates a drive signal to perform excitation vibration on the physical quantity detection element 100 and supplies the drive signal to the drive electrodes 112 of the physical quantity detection element 100 via a DS terminal. An oscillation current generated in the drive electrodes 113 by the excitation vibration of the physical quantity detection element 100 is input via a DG terminal, and the drive circuit 20 performs feedback control of an amplitude level of the drive signal so that the amplitude of the oscillation current is maintained constantly. The drive circuit 20 generates a detection signal SDET with the same phase as the drive signal and outputs the detection signal SDET to the detection circuit 30.

The alternating-current charges (detection currents) generated in the two detection electrodes 114 and 115 of the physical quantity detection element 100 are input via S1 and S2 terminals, and the detection circuit 30 detects the angular velocity component included in the alternating-current charges (detection currents) using the detection signal SDET, and generates and outputs a signal (angular velocity signal) VAO with a voltage level according to the magnitude of the angular velocity component.

The storage unit 50 includes a nonvolatile memory (not illustrated). The nonvolatile memory stores various kinds of trimming data (adjustment data or correction data) for the drive circuit 20 or the detection circuit 30. The nonvolatile memory can be configured as, for example, a metal oxide nitride oxide silicon (MONOS) memory or an electrically erasable programmable read-only memory (EEPROM). The storage unit 50 may further include a register (not illustrated) and may be configured such that the various kinds of trimming data stored in the nonvolatile memory are transmitted to the register and maintained when power is supplied to the physical quantity detection circuit 200 (when the voltage of the VDD terminal rises from 0 V to a desired voltage), and the various kinds of trimming data maintained in the register are supplied to the drive circuit 20 or the detection circuit 30.

The data processing circuit 40 is configured to include a digital calculation circuit 41 and an interface circuit 42.

The digital calculation circuit 41 operates by a master clock signal MCLK, converts the voltage level of the angular velocity signal VAO output by the detection circuit 30 into a digital value, subsequently performs an interpolation process based on a timing at which a reading request signal REQ is input, and outputs interpolated data obtained through the interpolation process as digital data VDO.

The interface circuit 42 performs a process of outputting the reading request signal REQ according to a communication signal transmitted by a micro control unit (MCU) 2 (which is an example of a control device) which is an external device of the physical quantity detection circuit 200 and a process of outputting the digital data VDO (interpolated data) output by the digital calculation circuit 41 to the MCU 2. The interface circuit 42 performs, for example, a process of reading data stored in the storage unit 50 (the nonvolatile memory or the register) in response to a request from the MCU 2 and outputting the data to the MCU 2 or a process of writing the data input from the MCU 2 on the storage unit 50 (the nonvolatile memory or the register). The interface circuit 42 is, for example, an interface circuit of a serial peripheral interface (SPI) bus. A selection signal, a clock signal, and a data signal which are communication signals transmitted by the MCU 2 are respectively input via SS, SCLK, and SI terminals of the physical quantity detection circuit 200 and the data signal is output to the MCU 2 via an SO terminal of the physical quantity detection circuit 200. The interface circuit 42 may be an interface circuit corresponding to any of various buses (for example, an inter-integrated circuit ($I^2C$) bus) other than the SPI bus.

The oscillation circuit 60 functions as a clock generation circuit that generates the master clock signal MCLK and outputs the master clock signal MCLK to the digital calculation circuit 41 included in the data processing circuit 40. The oscillation circuit 60 is configured as, for example, a ring oscillator or a CR oscillation circuit.

Configuration of Drive Circuit

Figure 5:
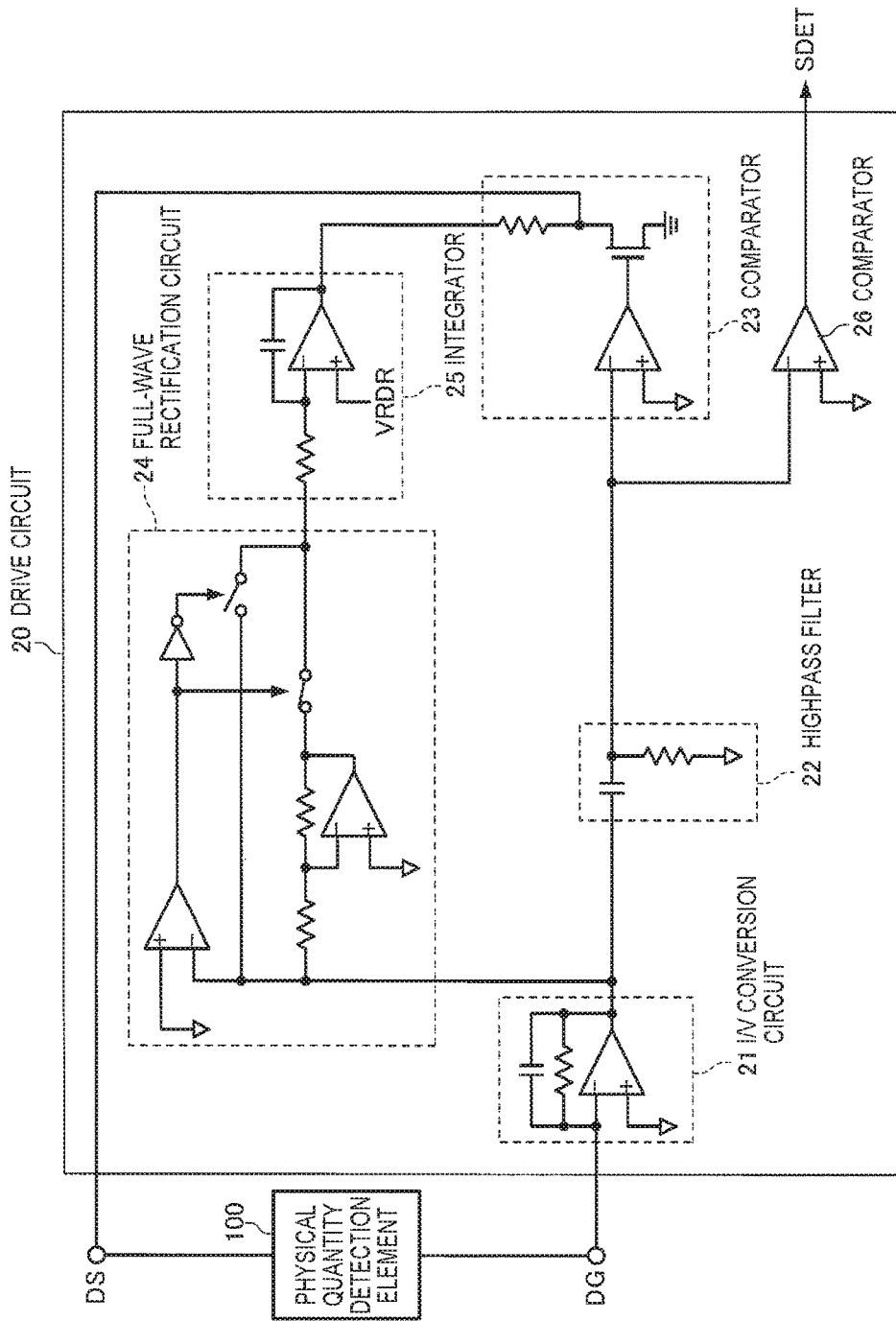
FIG. 5 is a diagram illustrating an example of the configuration of a drive circuit.

Next, the drive circuit 20 will be described. FIG. 5 is a diagram illustrating an example of the configuration of the drive circuit 20. As illustrated in FIG. 5, the drive circuit 20 according to the embodiment is configured to include an I/V conversion circuit 21, a highpass filter (HPF) 22, a comparator 23, a full-wave rectification circuit 24, an integrator 25, and a comparator 26. The drive circuit 20 according to the embodiment may be configured such that some of these elements may be omitted or changed or other elements may be added.

The I/V conversion circuit 21 converts the oscillation current generated by the excitation vibration of the physical quantity detection element 100 and input via the DG terminal into an alternating-current voltage signal.

The highpass filter 22 removes an offset of the output signal of the I/V conversion circuit 21.

The comparator 23 generates a binary signal by comparing the voltage of the output signal of the highpass filter 22 to the reference voltage, electrifies an NMOS transistor and outputs a low level when the binary signal is at a high level, does not electrify the NMOS transistor when the binary signal is at a low level, and outputs the output voltage of the integrator 25 pulled up via a resistor as the high level. Then, the output signal of the comparator 23 is supplied as a drive signal to the physical quantity detection element 100 via the DS terminal. By matching the frequency (drive frequency) of the drive signal with the resonance frequency of the physical quantity detection element 100, it is possible to stably oscillate the physical quantity detection element 100.

The full-wave rectification circuit 24 rectifies (performs full-wave rectification on) the output signal of the I/V conversion circuit 21 and outputs the direct-current signal.

The integrator 25 integrates the output voltage of the full-wave rectification circuit 24 using a desired voltage VRDR supplied from the reference voltage circuit 10 as a reference and outputs the output voltage. The output voltage of the integrator 25 is lower as the output of the full-wave rectification circuit 24 is high (as the amplitude of the output signal of the I/V conversion circuit 21 is larger). Accordingly, as an oscillation amplitude is larger, the voltage with the high level of the output signal (drive signal) of the comparator 23 is lower. As the oscillation amplitude is smaller, the voltage with the high level of the output signal (drive signal) of the comparator 23 is higher. Therefore, an auto gain control (AGC) is applied so that the oscillation amplitude is maintained constantly.

The comparator 26 generates a binary signal (square wave voltage signal) by amplifying the voltage of the output signal of the highpass filter 22 and outputs the binary signal as the detection signal SDET.

Configuration of Detection Circuit

Figure 6:
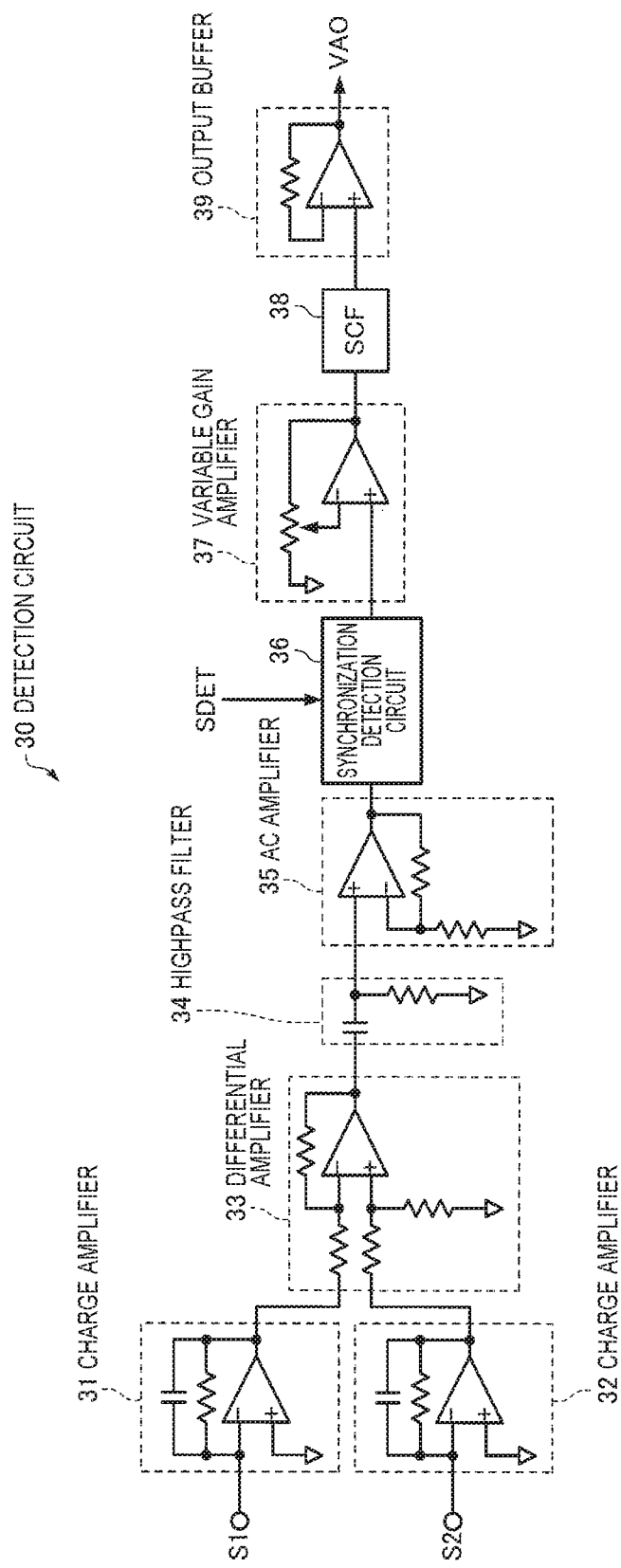
FIG. 6 is a diagram illustrating an example of the configuration of a detection circuit.

Next, the detection circuit 30 will be described. FIG. 6 is a diagram illustrating an example of the configuration of the detection circuit 30. As illustrated in FIG. 6, the detection circuit 30 according to the embodiment is configured to include charge amplifiers 31 and 32, a differential amplifier 33, a highpass filter (HPF) 34, an AC amplifier 35, a synchronization detection circuit 36, a variable gain amplifier 37, a switched capacitor filter (SCF) 38, and an output buffer 39. The detection circuit 30 according to the embodiment may be configured such that some of these elements may be omitted or changed, or other elements may be added.

The alternating-current charge (detection current) including the angular velocity component and the vibration leakage component is input from the detection electrode 114 of the vibrator element of the physical quantity detection element 100 to the charge amplifier 31 via the S1 terminal. Similarly, the alternating-current charge (detection current) including the angular velocity component and the vibration leakage component is input from the detection electrode 115 of the vibrator element of the physical quantity detection element 100 to the charge amplifier 32 via the S2 terminal.

The charge amplifiers 31 and 32 convert the input alternating-current charges (detection currents) into alternating-current voltage signals. The phase of the alternating-current charge (detection current) input to the charge amplifier 31 is different by 180° from the phase of the alternating-current charge (detection current) input to the charge amplifier 32. The phase of the output signal of the charge amplifier 31 and the phase of the output signal of the charge amplifier 32 are reverse (deviated by 180°).

The differential amplifier 33 performs differential amplification on the output signal of the charge amplifier 31 and the output signal of the charge amplifier 32. An in-phase component is cancelled by the differential amplifier 33 and a reverse-phase component is added and amplified.

The highpass filter 34 removes a direct-current component included in the output signal of the differential amplifier 33.

The AC amplifier 35 outputs an alternating-current voltage signal obtained by amplifying the output signal of the highpass filter 34.

The synchronization detection circuit 36 performs synchronization detection on the angular velocity component included in the output signal (detected signal) of the AC amplifier 35, using the detection signal SDET output by the drive circuit 20. For example, the synchronization detection circuit 36 can be configured as a circuit that selects the output signal of the AC amplifier 35 without change when the detection signal SDET is at the high level and selects a signal inverted from the output signal of the AC amplifier 35 with respect to the reference voltage when the detection signal SDET is at the low level.

The output signal of the AC amplifier 35 includes the angular velocity component and the vibration leakage component. The angular velocity component has the same phase as the detection signal SDET whereas having the reverse phase to the vibration leakage component. Therefore, the angular velocity component is subjected to the synchronization detection by the synchronization detection circuit 36, but the vibration leakage component is not detected.

The variable gain amplifier 37 amplifies or attenuates the output signal of the synchronization detection circuit 36 and outputs a signal with a desired voltage level, and the output signal of the variable gain amplifier 37 is input to the switched capacitor filter (SCF) 38.

The switched capacitor filter (SCF) 38 functions as a lowpass filter that removes a high-frequency component included in the output signal of the variable gain amplifier 37 and passes a signal of a frequency range decided in the specification. The frequency characteristics of the switched capacitor filter (SCF) 38 (lowpass filter) are decided by the frequency of a clock signal (not illustrated) obtained by stable oscillation of the physical quantity detection element 100 and a capacitance ratio of a capacitor (not illustrated). Therefore, there is the advantage in which a variation in the frequency characteristics is considerably smaller than in an RC lowpass filter.

The output signal of the switched capacitor filter (SCF) 38 is buffered by the output buffer 39 and is amplified or attenuated to a signal with a desired voltage level, as necessary. The output signal of the output buffer 39 is output as the angular velocity signal VAC from the detection circuit 30.

Configuration of Data Processing Circuit

Figure 7:
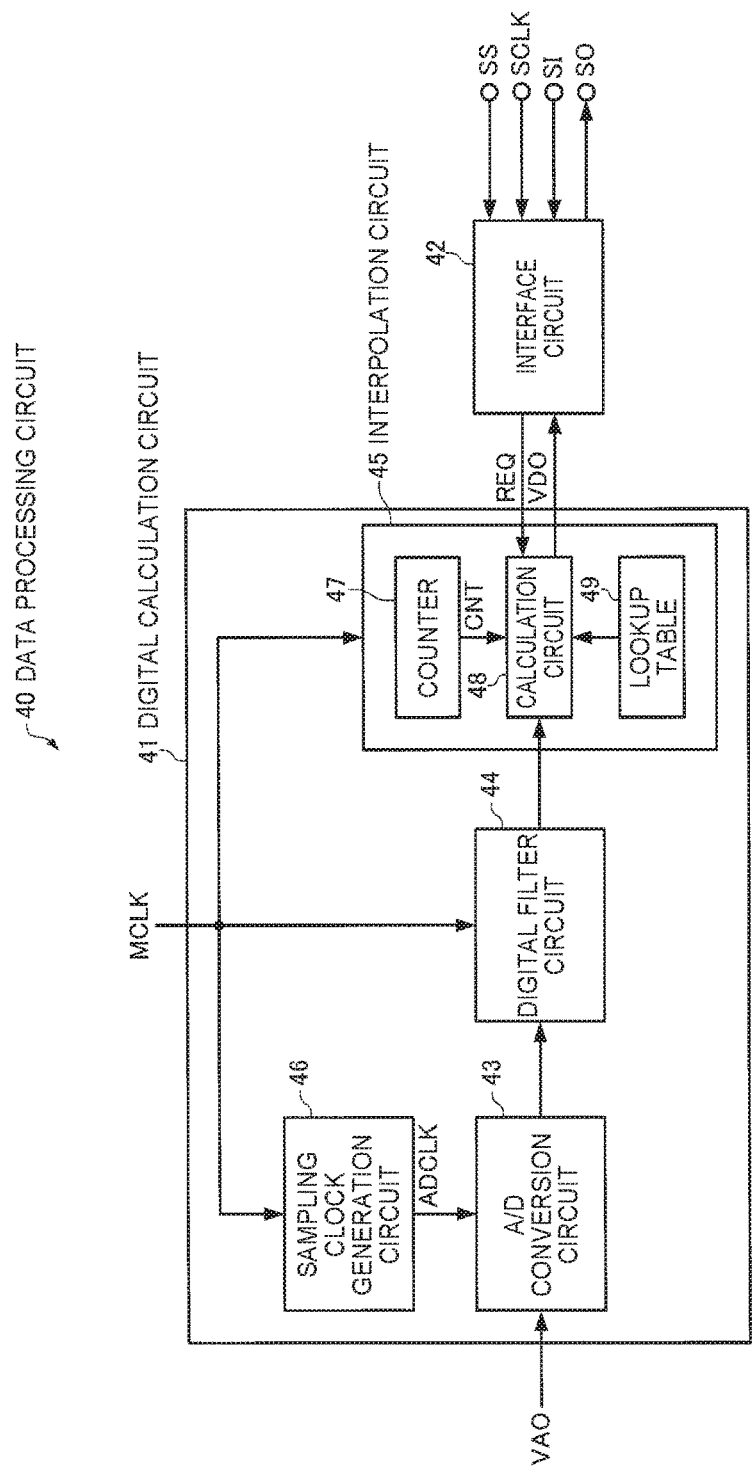
FIG. 7 is a diagram illustrating an example of the configuration of a data processing circuit.

Next, the details of the data processing circuit will be described. FIG. 7 is a diagram illustrating an example of the configuration of the data processing circuit 40. As illustrated in FIG. 1, the data processing circuit 40 according to the embodiment is configured to include the digital calculation circuit 41 and the interface circuit 42. As illustrated in FIG. 7, the digital calculation circuit 41 is configured to include an A/D conversion circuit 43, a digital filter circuit 44, an interpolation circuit 45, and a sampling clock generation circuit 46. The digital calculation circuit 41 according to the embodiment may be configured such that some of these elements may be omitted or changed, or other elements may be added.

The sampling clock generation circuit 46 generates a sampling clock signal ADCLK based on the master clock signal MCLK (the output signal of the oscillation circuit 60) and outputs the sampling clock signal ADCLK.

The A/D conversion circuit 43 samples the angular velocity signal VAC output by the detection circuit 30 in synchronization with the sampling clock signal ADCLK, converts a sampled voltage value into digital data, and outputs the digital data.

The signal (digital data) from the A/D conversion circuit 43 is input, and the digital filter circuit 44 performs a process of filtering the digital data in synchronization with the master clock signal MCLK.

The interpolation circuit 45 is a circuit that performs the interpolation process on the input digital signal (the digital signal from the digital filter circuit 44) and outputs interpolated data subjected to the interpolation process. In the embodiment, the interface circuit 42 outputs the reading request signal REQ making a request for outputting the interpolated data according to the input communication signals. The reading request signal REQ is input, and interpolation circuit 45 performs the interpolation process based on the digital signal input earlier than a timing at which the reading request signal REQ.

The interpolation circuit 45 outputs the interpolated data in response to the reading request signal REQ. The interpolated data is output as the digital data VDO to the outside of the data processing circuit 40 via the interface circuit 42.

The interpolation circuit 45 may perform the interpolation process based on a time from the input timing of the digital signal from the digital filter circuit 44 to the input timing of the reading request signal REQ and the plurality of digital signals input earlier than the input timing of the digital signal.

For example, the interpolation circuit 45 may perform the interpolation process by a Bi-Cubic method (cubic interpolation method). FIG. 8 is a diagram illustrating the Bi-Cubic method. As illustrated in FIG. 8, the interpolation circuit 45 sets input data (the digital signal from the digital filter circuit 44) more recently input with respect to the input timing of the reading request signal REQ to $x_3$, sets input data input before one more sampling period (corresponding to one period of the sampling clock signal ADCLK) of the reading request signal REQ to $x_2$, sets input data input before further one more sampling period of the reading request signal REQ to $x_1$, and sets input data input before still further one more sampling period of the reading request signal REQ to $x_0$. A time obtained by normalizing the time from the recently data input timing to the input timing of the reading request signal REQ as 1 at one sampling period is assumed to be d ($0 \le d < 1$). At this time, the interpolation circuit 45 performs the interpolation process by expression (1) of the Bi-Cubic method using the pieces of input data $x_0$, $x_1$, $x_2$, and $x_3$ to calculate interpolated data y at a timing later by the time d from the data input timing of the input data $x_1$.

$$y = x_0 \cdot h_1(d+1) + x_1 \cdot h_2(d) + x_2 \cdot h_2(1-d) + x_3 \cdot h_1(2-d) \quad (1)$$

In Expression (1), $h_1(d)$ and $h_2(d)$ are indicated in Expressions (2) and (3), respectively.

$$h_1(d) = (a+2) \cdot d^3 - (a+3) \cdot d^2 + 1 \quad (2)$$

$$h_2(d) = a \cdot d^3 - 5a \cdot d^2 + 8a \cdot d - 4a \quad (3)$$

In Expressions (2) and (3), a is any coefficient and a value in the range of −0.5 to −1.0 is generally used. Here, a small value (−0.5) of an absolute value is preferable to proliferate harmonic distortion occurring in the interpolated data y. Accordingly, when Expressions (2) and (3) are substituted to Expressions (1) as a=−0.5 for modification, Expression (4) is obtained.

$$y = (-0.5x_0 + 1.5x_1 - 1.5x_2 + 0.5x_3)d^3 + \quad (4)$$
$$(x_0 - 2.5x_1 + 2x_2 - 0.5x_3)d^2 + (-0.5x_0 + 0.5x_2)d + x_1$$

In the embodiment, the interpolation circuit 45 is configured to include a counter 47, a calculation circuit 48, and a lookup table 49 in order to perform the interpolation process in accordance with the Bi-Cubic method.

The counter 47 is a counter that counts up from 0 to SR−1 during one sampling period (one period of the sampling clock signal ADCLK) in synchronization with the master clock signal MCLK. The SR corresponds to a frequency ratio of the master clock signal MCLK to the sampling clock signal ADCLK.

FIG. 9 is a diagram illustrating examples of timing charts of the master clock signal MCLK, an output signal CNT of the counter 47, the sampling clock signal ADCLK, and the reading request signal REQ. As illustrated in the timing charts of FIG. 9, when n is the value of the output signal CNT of the counter 47 at the input timing of the reading request signal REQ, the time d illustrated in FIG. 8 is expressed in Expression (5) using n and SR.

$$d = \frac{n}{SR} \quad (5)$$

Accordingly, when Expression (5) is substituted to Expression (4) for modification, Expression (6) is obtained.

$$y = x_1 + \frac{x_2 - x_0}{2} \cdot \frac{n}{SR} + K_0 \cdot x_0 + K_1 \cdot x_1 + K_2 \cdot x_2 + K_3 \cdot x_3 \quad (6)$$

In Expression (6), coefficients $K_0$, $K_1$, $K_2$, and $K_3$ are indicated in Expressions (7), (8), (9), and (10), respectively.

$$K_0 = -\frac{1}{2}\left(\frac{n}{SR}\right)^3 + \left(\frac{n}{SR}\right)^2 \quad (7)$$

$$K_1 = \frac{3}{2}\left(\frac{n}{SR}\right)^3 - \frac{5}{2}\left(\frac{n}{SR}\right)^2 \quad (8)$$

-continued $$K_2 = -\frac{3}{2}\left(\frac{n}{SR}\right)^3 + 2\left(\frac{n}{SR}\right)^2 \quad (9)$$

$$K_3 = \frac{1}{2}\left(\frac{n}{SR}\right)^3 - \frac{1}{2}\left(\frac{n}{SR}\right)^2 \quad (10)$$

In the embodiment, the lookup table 49 stores data related to a relation between a calculation coefficient of the interpolation process and a timing d at which the reading request signal REQ is input. Specifically, as illustrated in FIG. 10, the range of 0 to SR−1 in which the value of the output signal CNT of the counter 47 is allowed is divided into a plurality of ranges (0 to $n_1-1$, $n_1$ to $n_2-1$, $n_2$ to $n_3-1$, etc.). Then, a relation between each range of the value of the CNT and each value of the coefficients $K_0$, $K_1$, $K_2$, and $K_3$ is stored in the lookup table 49.

The calculation circuit 48 calculates the values of Expression (6) with the coefficients $K_0$, $K_1$, $K_2$, and $K_3$ in the third to sixth terms (Bi-Cubic interpolation terms) of the right side of Expression (6) determined according to the lookup table 49. In this case, calculation of Expressions (7), (8), (9), and (10) is not necessary.

In the embodiment, the calculation circuit 48 is realized by continuously calculating multiplication of the second term (linear interpolation term) of the right side of Expression (6) and each multiplication of the third to sixth terms (Bi-Cubic interpolation terms) of the right side using each adder at all times. Accordingly, it is possible to reduce the circuit size of the calculation circuit 48 and it is possible to output the interpolated data y as the digital data VDO immediately in response to the reading request signal REQ input at asynchronous timing with the sampling clock signal ADCLK.

Advantages

In the physical quantity detection device 1 (the data processing circuit 40) according to the first embodiment, the interpolation circuit 45 outputs the digital data VDO subjected to the interpolation process according to the time d from the input timing (sampling timing) of the digital signal to the input timing of the reading request signal REQ. Specifically, as illustrated in FIG. 8, the interpolation circuit 45 performs the interpolation process by the Bi-Cubic method using the recent input data $x_3$, the input data $x_2$ before one sampling period, the input data $x_1$ before two sampling periods, and the input data $x_0$ before three sampling periods according to the time d from the input timing of the recent input data $x_3$ to the input timing of the reading request signal REQ, generates the interpolated data Y later by the time d from the input data $x_1$ before two sampling periods, and outputs the interpolated data y as the digital data VDO. The digital data VDO (the interpolated data y) is output later by two periods of the sampling period of the A/D conversion circuit 43, but is data which is sampled by the A/D conversion circuit 43 to be subjected to A/D conversion in synchronization with the input timing of the reading request signal REQ and indicates data subjected to the filtering process by the digital filter circuit 44 in a pseudo-manner. Accordingly, the physical quantity detection device 1 (the data processing circuit 40) according to the first embodiment can reduce occurrence of folding noise to the digital data VDO even when the sampling timing (the input timing of the digital signal to the interpolation circuit 45) by the A/D conversion circuit 43 is asynchronous with the reading request timing (the input timing of the reading request signal REQ) from the MCU 2.

1-2. Second Embodiment

In the physical quantity detection device 1 (the data processing circuit 40) according to the first embodiment, in order for the interpolation circuit 45 to output the interpolated data y in immediate response to the reading request signal REQ, the calculation circuit 48 necessarily performs addition at all times (performs the interpolation process at all times). Therefore, power consumption is considerable. In contrast, in a physical quantity detection device 1 according to a second embodiment, an interpolation circuit 45 performs an interpolation process in response to a reading request signal REQ. That is, the interpolation circuit 45 completes a correction process in one period of the master clock signal MCLK at an input timing of the reading request signal REQ and immediately outputs interpolated data y. Hereinafter, the same reference numerals are given to the same configurations as the first embodiment. Differences from the first embodiment will be described omitting the repeated description as the first embodiment.

The interpolation circuit 45 according to the second embodiment is configured to include a counter 47, a calculation circuit 48, and a lookup table 49 in order to perform an interpolation process by a Bi-Cubic method, as in the first embodiment (see FIG. 7).

As in the first embodiment, the counter 47 is a counter that counts up from 0 to SR−1 during one sampling period (one period of the sampling clock signal ADCLK) in synchronization with the master clock signal MCLK.

Figure 11:
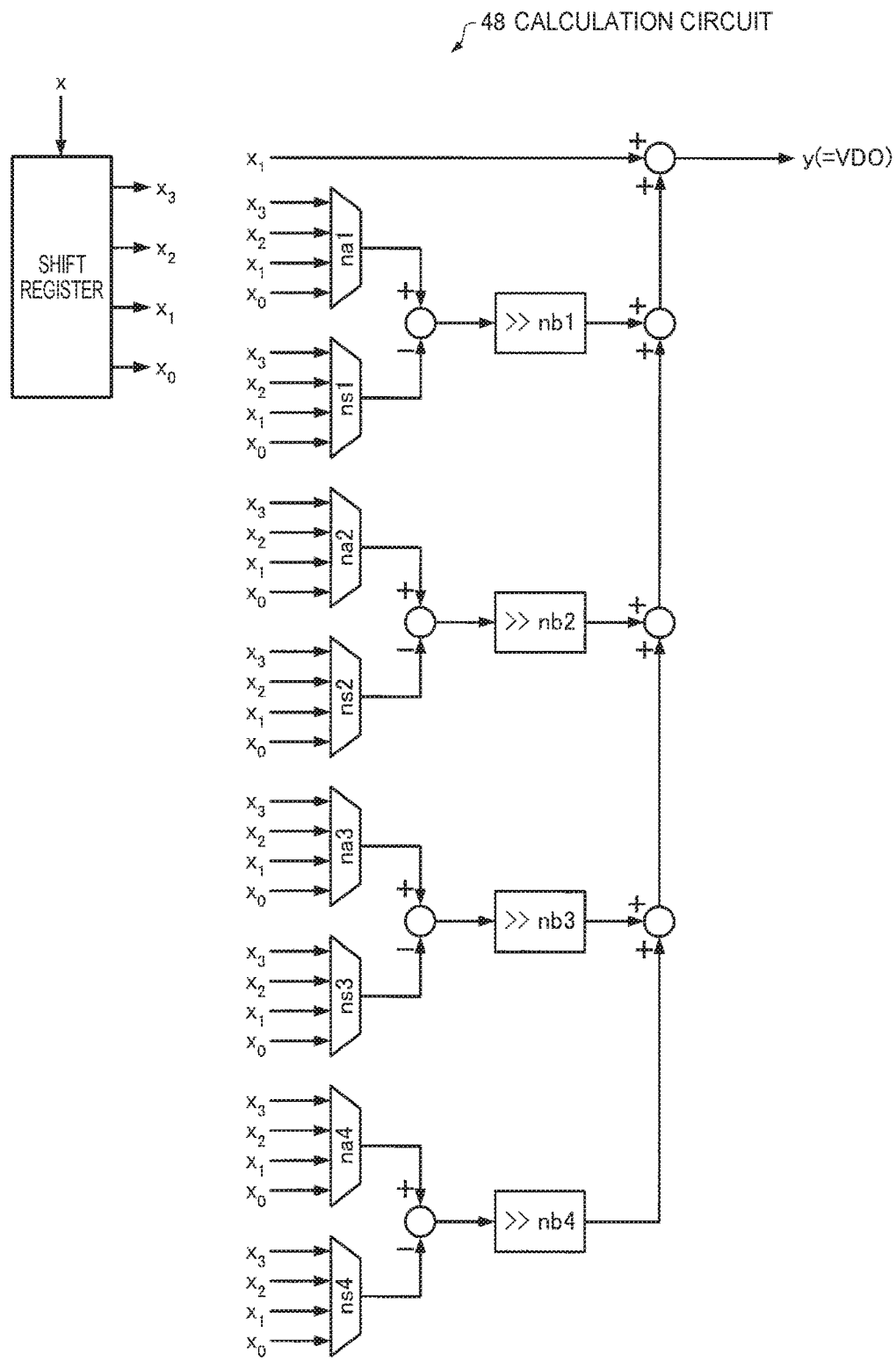
FIG. 11 is a diagram illustrating an example of the configuration of a calculation circuit according to a second embodiment.

As illustrated in FIG. 11, the calculation circuit 48 has four-step calculation stages. Each calculation stage i (where i=1 to 4) is configured to include two selectors nai and nsi that select one piece of data from four pieces of input data $x_3$, $x_2$, $x_1$, and $x_0$ output by a shift register, an adder-subtracter that subtracts mutual selected signals, and a calculator that performs bit shift of any amount. The calculation circuit 48 adds the output signals of the calculation stages by the adders to generate the interpolated data y.

Figures 12, 13:
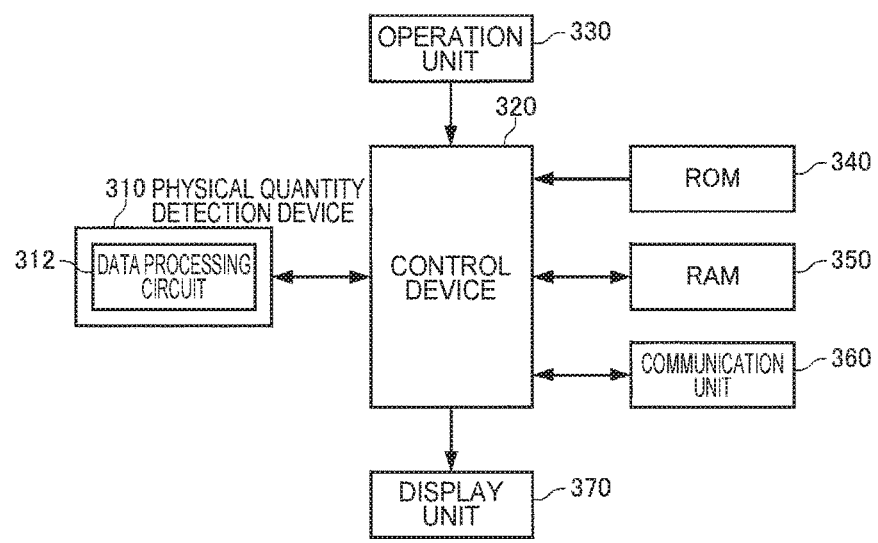
FIG. 12 is a diagram illustrating an example of a lookup table according to the second embodiment.
FIG. 13 is a functional block diagram illustrating an example of the configuration of an electronic apparatus according to the embodiment.

The lookup table 49 stores data related to a relation between a calculation coefficient of the interpolation process and a timing d at which the reading request signal REQ is input. Specifically, as illustrated in FIG. 12, the range of 0 to SR−1 in which the value of the output signal CNT of the counter 47 is allowed is divided into a plurality of ranges (0 to $n_1-1$, $n_1$ to $n_2-1$, $n_2$ to $n_3-1$, etc.). Then, a relation between each range of the value of the CNT, and selected signals of two selectors included in each calculation stage of the calculation circuit 48 and a bit shift amount of the calculator is stored in the lookup table 49.

The calculation circuit 48 can generate the interpolated data y in one period of the master clock signal MCLK by calculating the values of the coefficients of $d^3$, $d^2$, and d of the right side of Expression (4) in the four calculation stages with reference to the lookup table 49. Accordingly, it is possible to reduce the circuit size of the calculation circuit 48 and it is possible to output the interpolated data y as the digital data VDO immediately in response to the reading request signal REQ input at asynchronous timing with the sampling clock signal ADCLK.

As in the first embodiment, the physical quantity detection device 1 (the data processing circuit 40) according to the second embodiment can reduce occurrence of folding noise to the digital data VDO even when the sampling timing (the input timing of the digital signal to the interpolation circuit 45) by the A/D conversion circuit 43 is asynchronous with the reading request timing (the input timing of the reading request signal REQ) from the MCU 2.

Further, in the physical quantity detection device 1 (the data processing circuit 40) according to the second embodiment, the interpolation circuit 45 can start the interpolation process in response to the reading request signal REQ and output the digital data VDO (the interpolated data y) immediately (after one period of the master clock signal) by configuring the calculation circuit 48 as in FIG. 11 and configuring the lookup table 49 as in FIG. 12. Accordingly, in the physical quantity detection device 1 (the data processing circuit 40), it is not necessary for the calculation circuit 48 to perform the interpolation process at all times. Therefore, it is possible to reduce power consumption.

2. Electronic Apparatus

FIG. 13 is a functional block diagram illustrating an example of the configuration of an electronic apparatus according to an embodiment. As illustrated in FIG. 13, an electronic apparatus 300 according to an embodiment is configured to include a physical quantity detection device 310, a control device (MCU) 320, an operation unit 330, a read-only memory (ROM) 340, a random access memory (RAM) 350, a communication unit 360, and a display unit 370. The electronic apparatus according to the embodiment may be configured such that some of these constituent elements (units) in FIG. 13 may be omitted or changed, or other elements may be added.

The physical quantity detection device 310 is a device that detects a physical quantity based on an analog signal related to a physical quantity output by a physical quantity detection element (not illustrated) and outputs digital data according to the detected physical quantity. The physical quantity detection device 310 may be, for example, an inertial measurement device that detects at least some of physical quantities such as acceleration, an angular velocity, a velocity, angular acceleration, and a force or may be an inclinometer that measures an inclination angle. As the physical quantity detection device 310, for example, the physical quantity detection device 1 according to the above-described embodiment can be applied. The physical quantity detection device 310 is configured to include a data processing circuit 312. As the data processing circuit 312, for example, the data processing circuit 40 according to the above-described embodiment can be applied.

The control device (MCU) 320 transmits a communication signal to the physical quantity detection device 310 according to a program stored in the ROM 340 or the like and performs various calculation processes or control processes using output data of the physical quantity detection device 310. Additionally, the control device (MCU) 320 performs, for example, various processes according to operation signals from the operation unit 330, a process of controlling the communication unit 360 to perform data communication with an external device, and a process of transmitting display signals to display various kinds of information on the display unit 370.

The operation unit 330 is an input device configured to include an operation key and a button switch and outputs an operation signal according to a manipulation performed by a user to the control device (MCU) 320.

The ROM 340 stores programs, data, or the like used for the control device (MCU) 320 to perform various calculation processes or control processes.

The RAM 350 is used as a work area of the control device (MCU) 320 and temporarily stores, for example, programs or data read from the ROM 340, data input from the operation unit 330, and calculation results or the like processed according to various programs by the control device (MCU) 320.

The communication unit 360 performs various controls to establish data communication between the control device (MCU) 320 and an external device.

The display unit 370 is a display device configured to include a liquid crystal display (LCD) and displays various kinds of information based on display signals input from the CPU 320. The display unit 370 may include a touch panel functioning as the operation unit 330.

By applying, for example, the physical quantity detection device 1 according to the above-described embodiment as the physical quantity detection device 310 or applying, for example, the data processing circuit 40 according to the above-described embodiments as the data processing circuit 312 included in the physical quantity detection device 310, it is possible to realize an electronic apparatus with high reliability.

As the electronic apparatus 300, various electronic apparatuses can be considered. Examples of the electronic apparatus 300 include a personal computer (for example, a mobile personal computer, a laptop personal computer, or a tablet personal computer), a moving object terminal such as a smartphone or a portable telephone, a digital camera, an ink jet ejection apparatus (for example, an ink jet printer), a storage area network apparatus such as a router or a switch, a local area network apparatus, a mobile station terminal base station apparatus, a television, a video camera, a video recorder, a car navigation apparatus, a real-time clock apparatus, a pager, an electronic organizer (also including a communication function unit), an electronic dictionary, a calculator, an electronic game apparatus, a game controller, a word processor, a workstation, a television telephone, a monitoring television monitor, electronic binoculars, a POS terminal, a medical apparatus (for example, an electronic thermometer, a blood-pressure meter, a blood-sugar meter, an electrocardiographic apparatus, an ultrasonic diagnosis apparatus, and an electronic endoscope), a fish finder, various measurement apparatuses, meters (for example, meters of vehicles, airplanes, and ships), a flight simulator, a head-mounted display, a motion tracing apparatus, a motion tracking apparatus, a motion controller, and a pedestrian dead reckoning (PDR) apparatus.

Figure 14:
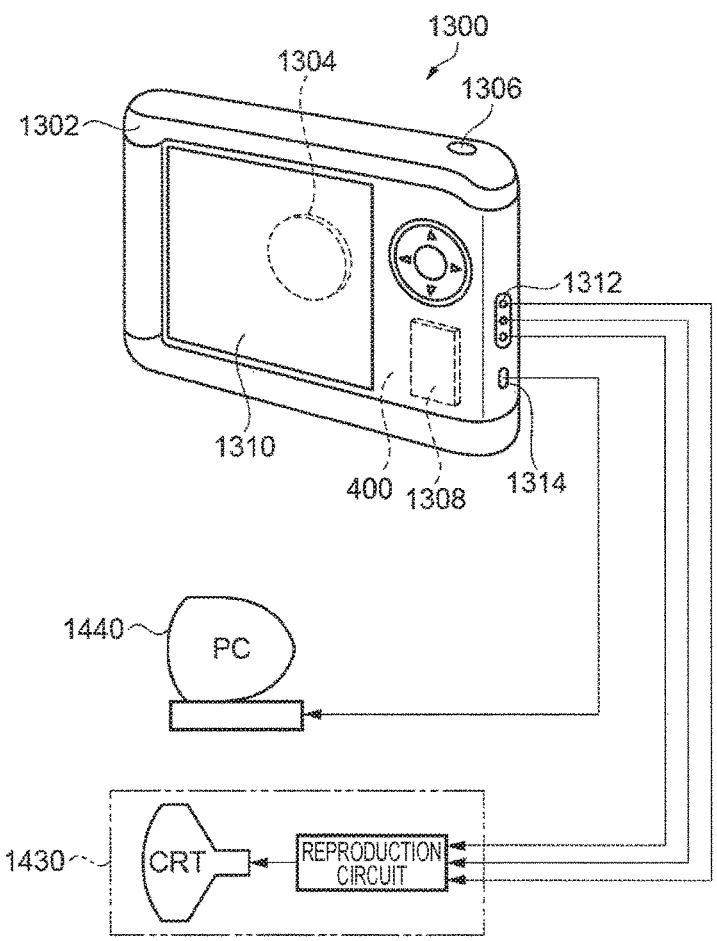
FIG. 14 is a diagram illustrating an example of the outer appearance of the electronic apparatus according to an embodiment.

FIG. 14 is a perspective view schematically illustrating a digital still camera 1300 which is an example of the electronic apparatus 300 according to the embodiment. In FIG. 14, connection with an external apparatus is also simply illustrated. Here, a normal camera exposes a silver-salt photo film by a light image of a subject, but the digital camera 1300 performs photoelectric conversion on a light image of a subject using an image sensor such as a charge coupled device (CCD) and generate an imaging signal (image signal).

In the digital camera 1300, a display unit 1310 is installed on the rear surface of a case (body) 1302 to perform display based on the imaging signal generated by the CCD. The display unit 1310 functions as a finder that displays a subject as an electronic image. A light-receiving unit 1304 including an optical lens (imaging optical system) or a CCD is installed on the front surface (the rear surface side of the drawing) of the case 1302. When a photographer confirms a subject image displayed on the display unit 1310 and presses a shutter button 1306, an imaging signal of the CCD at that time is transmitted and stored in a memory 1308. In the digital camera 1300, a video signal output terminal 1312 and a data communication input/output terminal 1314 are provided on a side surface of the case 1302. As illustrated, a television monitor 1430 is connected to the video signal output terminal 1312 and a personal computer 1440 is connected to the data communication input/output terminal 1314, as necessary. The imaging signal stored in the memory 1308 is configured to be output to the television monitor 1430 or the personal computer 1440 through a predetermined operation. The digital camera 1300 includes the physical quantity detection device 310 and performs, for example, a process such as camera-shake correction using output data of the physical quantity detection device 310.

3. Moving Object

Figure 15:
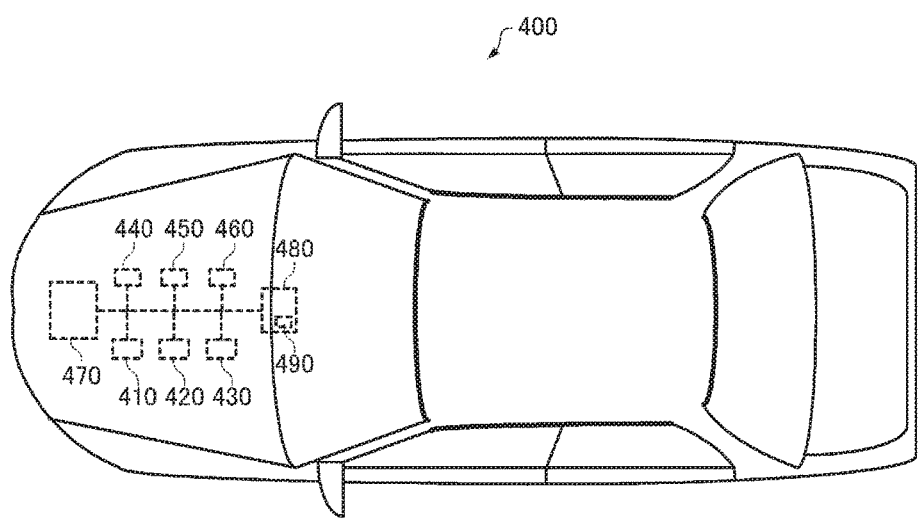
FIG. 15 is a diagram illustrating an example of a moving object according to the embodiment.

FIG. 15 is a diagram (top view) illustrating an example of a moving object according to an embodiment. A moving object 400 illustrated in FIG. 15 is configured to include physical quantity detection devices 410, 420, and 430, controllers 440, 450, and 460, a battery 470, and a navigation device 480. The moving object according to the embodiment may be configured such that some of these elements (units) in FIG. 15 may be omitted or changed, or other elements may be added.

The physical quantity detection devices 410, 420, and 430, the controllers 440, 450, and 460, and the navigation 480 operate with a power supply voltage supplied from the battery 470.

The controllers 440, 450, and 460 are control devices that transmit communication signals to the physical quantity detection devices 410, 420, and 430, respectively, and perform various kinds of control of a posture control system, a rollover prevention system, a brake system, and the like using output data of the physical quantity detection devices 410, 420, and 430.

The navigation device 480 displays the position of the moving object 400, a time, and other various kinds of information based on output information of an included GPS receiver (not illustrated) on a display. The navigation device 480 includes a physical quantity detection device 490, and thus continuously displays necessary information by calculating the position or the direction of the moving object 400 based on an output signal of the physical quantity detection device 490 even when GPS radio waves do not arrive.

The physical quantity detection devices 410, 420, 430, and 490 are devices that detect physical quantities based on analog signals related to the physical quantities output by physical quantity detection elements (not illustrated) and output digital data according to the detected physical quantities. For example, an angular velocity sensor, an acceleration sensor, and a velocity sensor, and an inclinometer are used.

For example, the physical quantity detection device 1 according to the above-described embodiments can be applied as the physical quantity detection devices 410, 420, 430, and 490 or the data processing circuit 40 according to the above-described embodiments can be applied as data processing circuits (not illustrated) included in the physical quantity detection devices 410, 420, 430, and 490, so that a moving object with high reliability can be realized.

Various moving objects can be considered as the moving object 400. For example, an automobile (also including an electric automobile), an airplane such as a jet plane or a helicopter, a ship, a rocket, and an artificial satellite can be exemplified.

The invention is not limited to the embodiments, various modifications can be made within the scope of the gist of the invention.

For example, in the above-described embodiments, the interpolation circuit 45 performs the interpolation process by the Bi-Cubic method. However, in addition to the Bi-Cubic method, various methods such as a nearest neighbor method (a nearest neighbor interpolation method or a most adjacent interpolation method), a bilinear method (linear interpolation method), and a Lanczos method can be used.

In the above-described embodiments, the angular velocity detection device including the physical quantity detection element 100 detecting an angular velocity has been exemplified in the description. However, the invention can also be applied to physical quantity detection devices including physical quantity detection elements detecting various physical quantities. The physical quantity detected by the physical quantity detection element is not limited to an angular velocity, but may be angular acceleration, acceleration, a velocity, a force, or the like. The vibrator element of the physical quantity detection element may not be of the double T type, but may be, for example, of a tuning fork type, a sinking comb type, or a tuning bar type with a triangular prism, a quadrangular prism, a columnar shape, or the like. As the material of the vibrator element of the physical quantity detection element, instead of quartz crystal ($SiO_2$), for example, a piezoelectric material such as a piezoelectric single crystal such as lithium tantalate ($LiTaO_3$) or lithium niobate ($LiNbO_3$) or a piezoelectric ceramics such as lead zirconate titanate (PZT) may be used, or a silicon semiconductor may be used. For example, a piezoelectric thin film of zinc oxide (ZnO) or aluminum nitride (AlN) interposed between drive electrodes may be disposed in a part of the surface of a silicon semiconductor. The physical quantity detection element is not limited to the piezoelectric type element, but may be a vibration type element such as an electrodynamic type, an electrostatic capacitance type, an eddy-current type, an optical type, a strain gage type. Alternatively, the method of the physical quantity detection element is not limited to a vibration type, but may be an optical type, a rotation type, or a fluid type.

The above-described embodiments and modification examples are merely examples and the invention is not limited thereto. For example, the embodiments and the modification examples can also be appropriately combined.

The invention includes substantially the same configurations (for example, configurations in which the functions, the methods, and the results are the same or configurations in which the goals and the advantages are the same) as the configurations described in the embodiments. The invention includes configurations in which unessential portions of the configurations described in the embodiments are substituted. The invention includes configurations in which the same operation and advantages as the configurations described in the embodiments or configurations in which the same goals can be achieved. The invention includes configurations in which known technologies are added to the configurations described in the embodiments.

The entire disclosure of Japanese Patent Application No. 2015-059326, filed Mar. 23, 2015 is expressly incorporated by reference herein.

What is claimed is:

1. A data processing circuit comprising:
   an interpolation circuit that performs an interpolation process on an input digital signal and outputs interpolated data subjected to the interpolation process,
   wherein a reading request signal making a request for outputting the interpolated data is input, and the interpolation circuit performs the interpolation process based on a plurality of digital signals input earlier than a timing at which the reading request signal is input, and
   a plurality of calculation coefficients of the interpolation process is determined in accordance with the timing of the reading request signal, wherein each of the plurality of calculation coefficients corresponds to respective ones of the plurality of digital signals input earlier than the timing at which the reading request signal is input.

2. The data processing circuit according to claim 1, further comprising:
an interface circuit,
wherein the interface circuit outputs the reading request signal according to an input communication signal,
wherein the interpolation circuit outputs the interpolated data in response to the reading request signal, and
wherein the interpolated data is output via the interface circuit.

3. The data processing circuit according to claim 2,
wherein the interpolation circuit performs the interpolation process based on a time from an input timing of the digital signal to an input timing of the reading request signal and the plurality of the digital signals that input earlier than the input timing of the digital signal.

4. The data processing circuit according to claim 3,
wherein the interpolation circuit performs the interpolation process by a cubic interpolation method.

5. The data processing circuit according to claim 2,
wherein the interpolation circuit performs the interpolation process by a cubic interpolation method.

6. The data processing circuit according to claim 1,
wherein the interpolation circuit performs the interpolation process based on a time from an input timing of the digital signal to an input timing of the reading request signal and the plurality of the digital signals that input earlier than the input timing of the digital signal.

7. The data processing circuit according to claim 6,
wherein the interpolation circuit performs the interpolation process by a cubic interpolation method.

8. The data processing circuit according to claim 1,
wherein the interpolation circuit performs the interpolation process by a cubic interpolation method.

9. The data processing circuit according to claim 1,
wherein the interpolation circuit performs the interpolation process in response to the reading request signal.

10. The data processing circuit according to claim 1,
wherein the interpolation circuit stores data related to a relation between one of the plurality of calculation coefficients of the interpolation process and the timing at which the reading request signal is input.

11. A physical quantity detection circuit comprising:
an A/D conversion circuit that performs A/D conversion on an analog signal related to a physical quantity;
a digital filter circuit to which a signal from the A/D conversion circuit is input;
an interpolation circuit to which a digital signal from the digital filter circuit is input, which performs an interpolation process on the digital signal, to which a reading request signal making a request for outputting interpolated data subjected to the interpolation process is input, and which performs the interpolation process based on a plurality of digital signals input earlier than a timing at which the reading request signal is input; and
an interface circuit that outputs the reading request signal according to an input communication signal,
wherein the interpolated data is output via the interface circuit, and
a plurality of calculation coefficients of the interpolation process is determined in accordance with the timing of the reading request signal, wherein each of the plurality of calculation coefficients corresponds to respective ones of the plurality of digital signals input earlier than the timing at which the reading request signal is input.

12. The physical quantity detection circuit according to claim 11,
wherein the interpolation circuit performs the interpolation process in response to the reading request signal.

13. The physical quantity detection circuit according to claim 12,
wherein the interpolation circuit stores data related to a relation between one of the plurality of calculation coefficients of the interpolation process and the timing at which the reading request signal is input.

14. A physical quantity detection device comprising:
the physical quantity detection circuit according to claim 12; and
a physical quantity detection element,
wherein the analog signal is a signal output from the physical quantity detection element.

15. The physical quantity detection circuit according to claim 11,
wherein the interpolation circuit stores data related to a relation between one of the plurality of calculation coefficients of the interpolation process and the timing at which the reading request signal is input.

16. A physical quantity detection device comprising:
the physical quantity detection circuit according to claim 15; and
a physical quantity detection element,
wherein the analog signal is a signal output from the physical quantity detection element.

17. A physical quantity detection device comprising:
the physical quantity detection circuit according to claim 11; and
a physical quantity detection element,
wherein the analog signal is a signal output from the physical quantity detection element.

18. The physical quantity detection device according to claim 17,
wherein the physical quantity detection element is an inertial sensor.

19. An electronic apparatus comprising:
the physical quantity detection device according to claim 17; and
a control device that transmits the communication signal.

20. A moving object comprising:
the physical quantity detection device according to claim 17; and
a control device that transmits the communication signal.

* * * * *